(12) United States Patent  
Cannon

(10) Patent No.: US 6,639,796 B2  
(45) Date of Patent: Oct. 28, 2003

(54) FASTENERLESS CLIP FOR QUICK INSTALLATION AND REMOVAL OF SYSTEM COMPONENTS IN A COMPUTER SYSTEM

(75) Inventor: James Edward Cannon, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/056,151

(22) Filed: Jan. 24, 2002

(65) Prior Publication Data

US 2003/0137806 A1 Jul. 24, 2003

(51) Int. Cl.[7] ................................................. H05K 7/20
(52) U.S. Cl. ........................ 361/695; 24/457; 248/505; 361/710; 361/825; 454/184
(58) Field of Search ................... 24/295–296, 457–458; 248/27.1, 27.3, 505, 510; 257/718–719, 726–727; 361/687, 694–697, 710, 719–721, 807–810, 825; 417/423.5; 415/213.1; 454/184

(56) References Cited

U.S. PATENT DOCUMENTS

| | | | |
|---|---|---|---|
| 5,123,721 A | | 6/1992 | Seo |
| 5,136,466 A | | 8/1992 | Remise et al. |
| 5,319,519 A | | 6/1994 | Sheppard et al. |
| 5,448,495 A | * | 9/1995 | Liu ............................ 361/687 |
| 5,680,293 A | | 10/1997 | McAnally et al. |
| 5,896,270 A | * | 4/1999 | Tsui ........................... 361/719 |
| 5,953,208 A | * | 9/1999 | Katsui ........................ 361/697 |
| 6,297,954 B1 | | 10/2001 | Seo |

* cited by examiner

Primary Examiner—Gregory Thompson

(57) ABSTRACT

A fastenerless clip attaches a system component to the inside of a chassis of a computer system. The clip is detachably mountable and includes a clip body with a resilient portion to provide a compressive force that securely holds the system component in position against a face of the chassis. The fastenerless clip is useful in attaching rotary cooling fans to a lateral face of a computer system chassis.

19 Claims, 8 Drawing Sheets

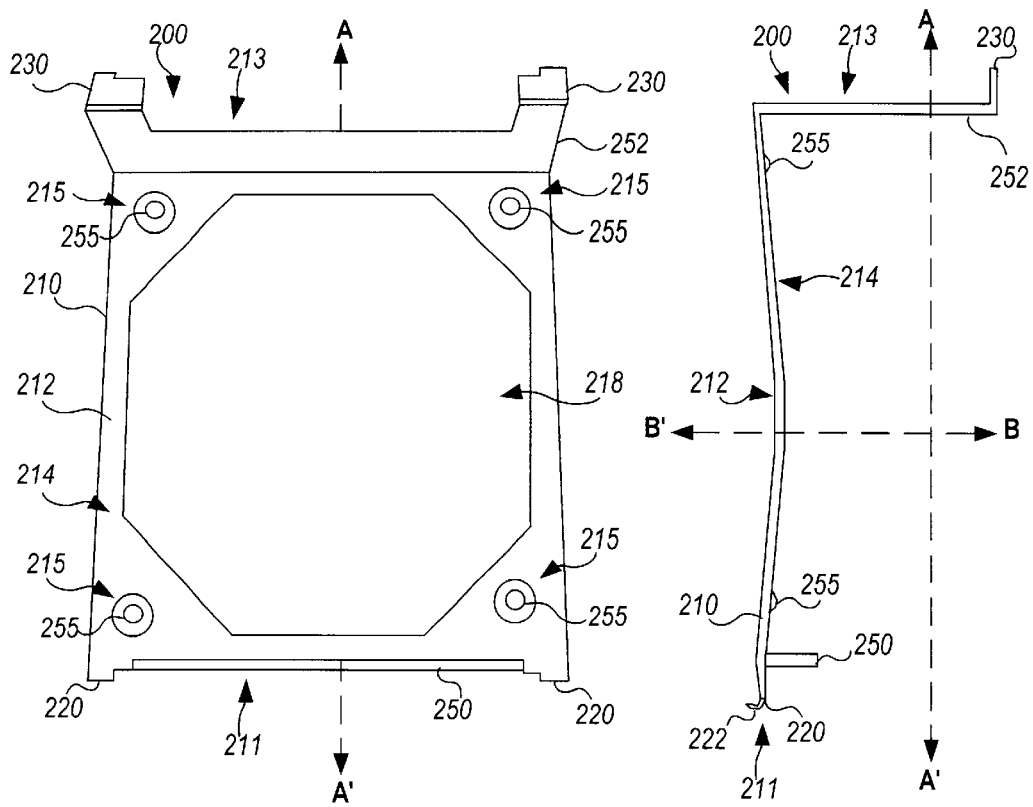
*FIG. 2A*  *FIG. 2B*
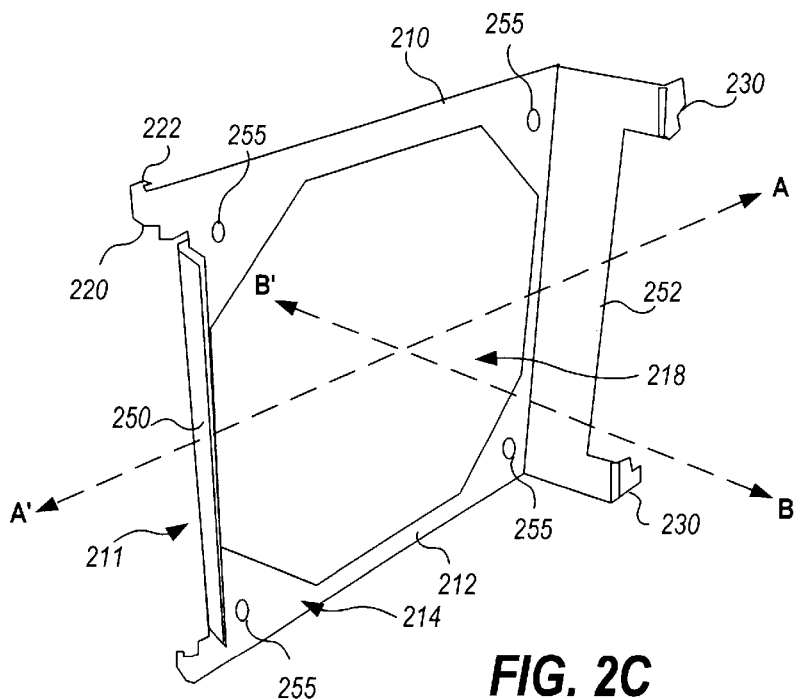
*FIG. 2C*

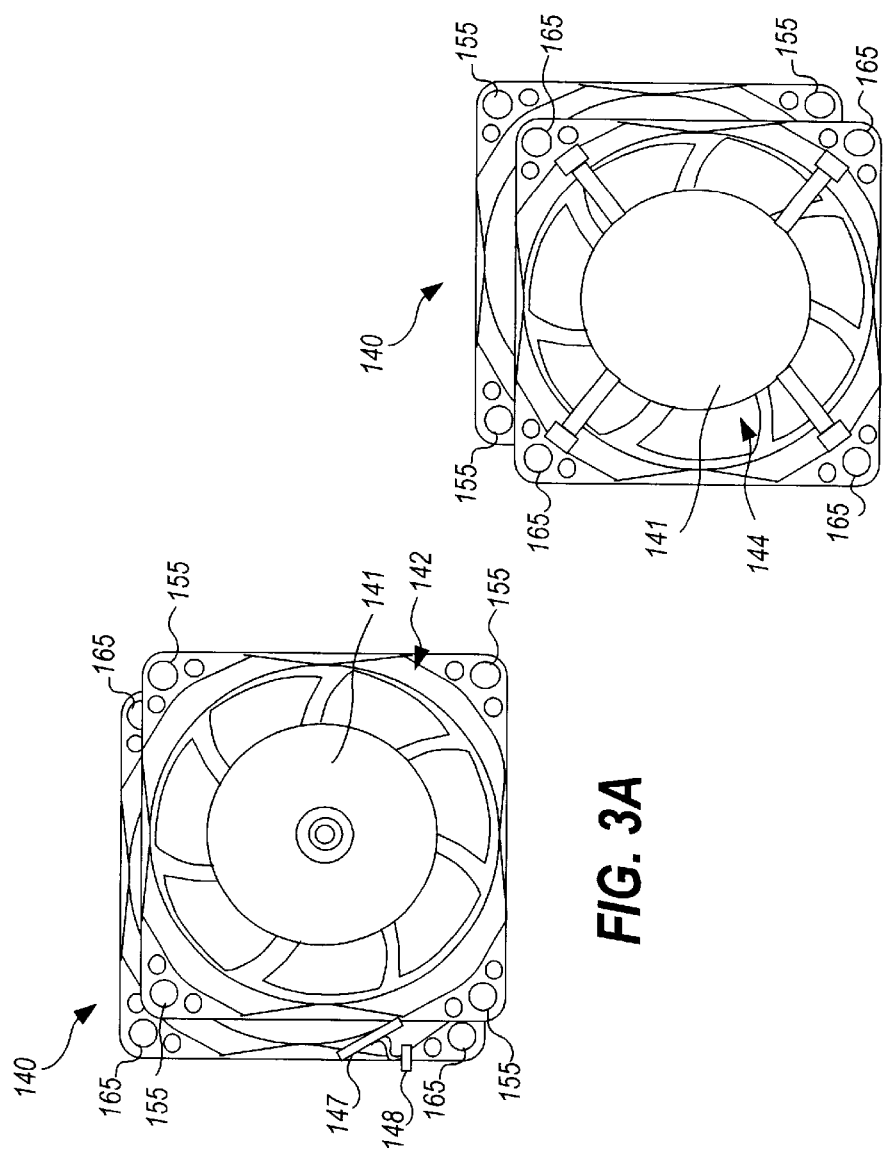

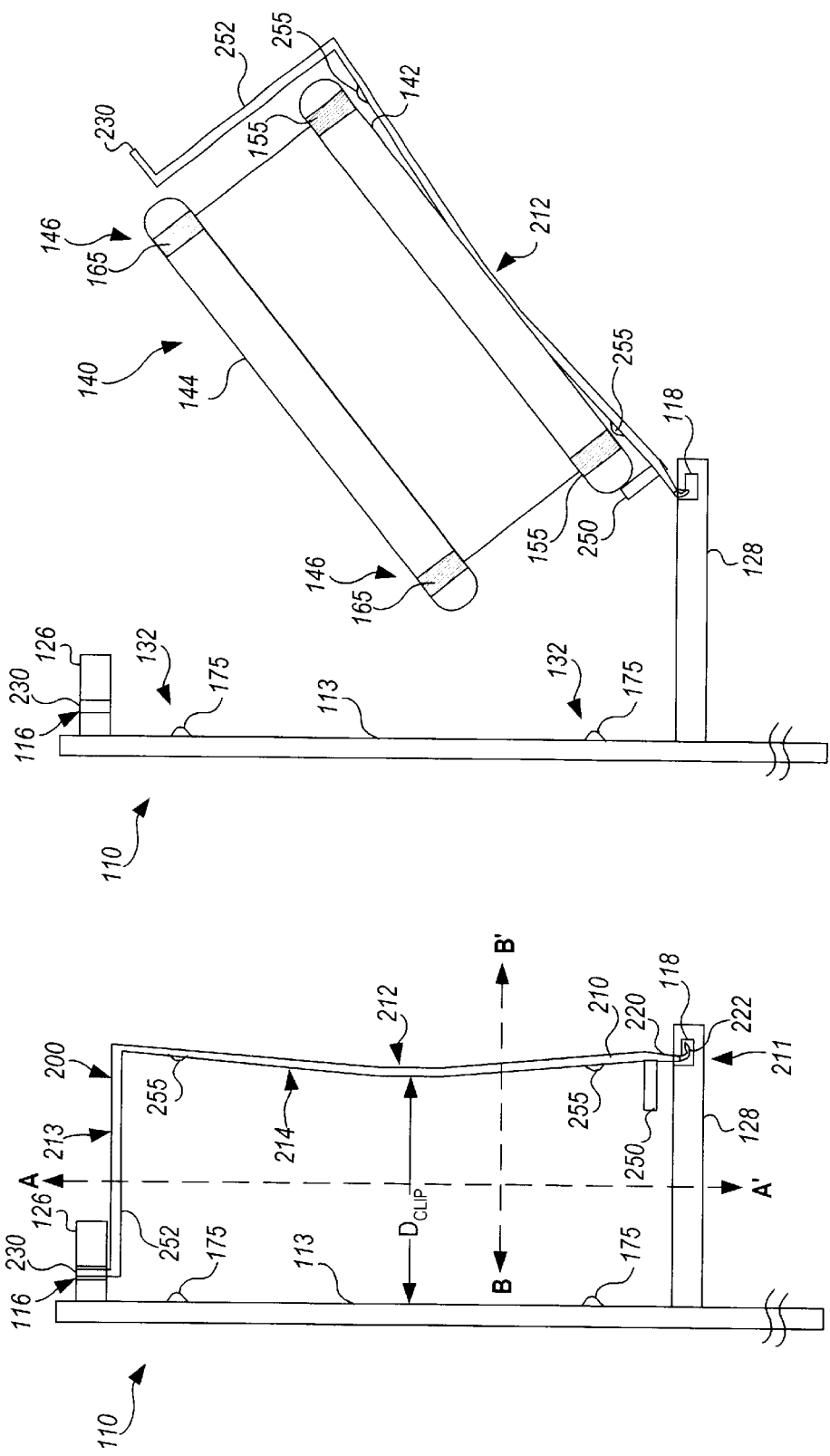

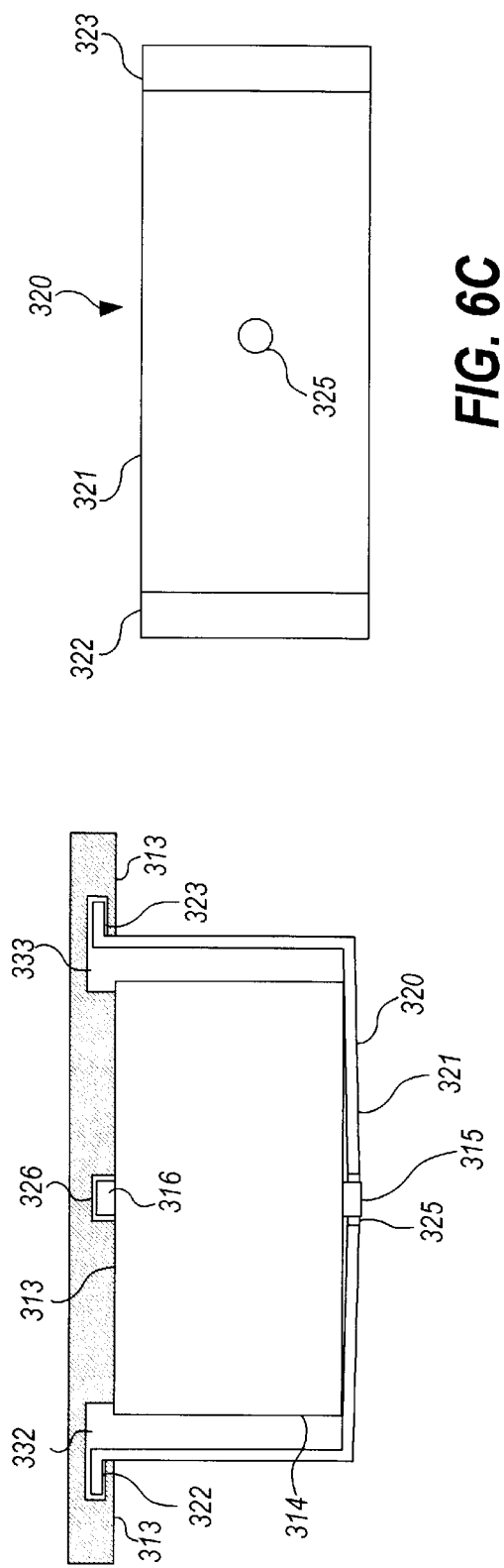
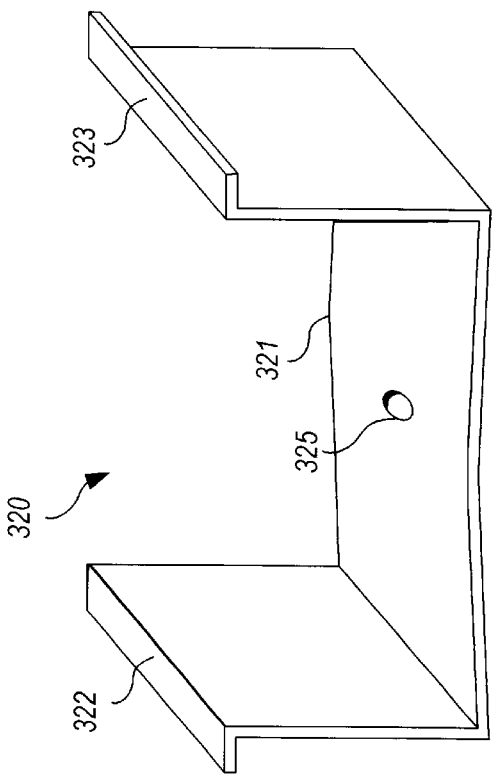
FIG. 6A
FIG. 6B
FIG. 6C

FASTENERLESS CLIP FOR QUICK INSTALLATION AND REMOVAL OF SYSTEM COMPONENTS IN A COMPUTER SYSTEM

FIELD OF THE INVENTION

The present invention relates, in general, to computer system assembly and, more particularly, to a fastenerless clip that allows fast simple attachment and removal of system components, such as a rotary fans, to a computer system chassis.

BACKGROUND OF THE INVENTION

The increasing reliance upon computer systems to collect, process, and analyze data has led to the continuous improvement of the system assembly process and associated hardware.

A typical computer system comprises one or more circuit boards and various semi-autonomous system components such as hard disk drives, peripheral storage devices, and rotary cooling fans. The circuit boards and system components are typically housed together in a housing called a chassis.

With the trend towards smaller and sleeker packaging designs, the positioning of the various circuit boards and system components within the chassis is the subject of much study. Often certain circuit boards and components must be positioned within a predetermined distance of one another to meet electrical cabling specifications. On the other hand, due to the high amount of heat dissipated by the electrical circuit boards and components, a certain amount of airspace must often be maintained between the various circuit boards and components to allow sufficient air flow needed for cooling the components.

Attachment of circuit boards and system components within the chassis is another area of concern. If the computer system is to be mass-produced, considerations for fast, easy assembly must be addressed; accordingly, the circuit boards and system components must be easy to install within a short amount of time. Attachment of the components must be secure and not subject to loosening over time due to system vibration, for example caused by motors and other components with moving parts such as rotary cooling fans. Such loosening results in noise which can interfere with the performance of the system.

One method of attaching system components to a computer chassis is to attach braces onto each side of the component using fasteners. Typically these braces have resilient portions or projections on the side that result in a firm fit between the peripheral and the bay in the computer housing. One example of this method is shown in U.S. Pat. No. 5,136,466 to Remise entitled Mounting Device for Detachably Mounting a Plurality of Computer Peripherals.

Another method of securing system components within computer housings is to slide the component in through the front of the bay to secure the peripheral to the computer system. Some techniques for slidably mounting a peripheral device into a computer system are shown in U.S. Pat. No. 5,319,519 to Sheppard entitled Housing with Latch and Ejection Mechanism Air Portable Hard Disk Drive, and U.S. Pat. No. 5,123,721 to Seo entitled Device for Securing Peripheral Equipment of Computer.

The above described methods of system component attachment have the disadvantage of requiring fasteners to be inserted into the component itself, and of requiring the components to be compatible with the bracketing method. In addition, the design of the attachment mechanism is complicated, thus requiring more assembly time.

To eliminate some of the assembly time required to mount a system component into a computer system, fastenerless mounting systems have been developed. One fastenerless mounting system is shown in U.S. Pat. No. 5,680,293 to McAnally entitled Screwless Hard Disk Drive Mounting in a Computer System with a Chassis via a First Bracket Rigidly Mounted to the Chassis and a Second Bracket Movably Mounted to the Chassis. McAnally '293 describes a bracket system that secures a hard disk drive to a dual leaf spring and bracket combination. The bracket requires that a user position a hard drive in a computer housing and then place a brace over one side of the hard drive.

Another fastenerless mounting system is shown in U.S. Pat. No. 6,297,954 to Seo entitled Peripheral Mounting System For A Computer System. Seo '954 describes a pair of brace devices to secure a peripheral device to a computer chassis. A brace device, constructed using a first bracket and a second bracket, that is slidably engageable with the first bracket, is inserted between the two lateral faces of the peripheral device and the lateral faces of the bay. The brace devices physically connect to the peripheral device by plugs that are inserted into hollows in the peripheral body to hold it in position and exert a compressive force to further secure the peripheral in position.

An example problematic area for contemporary system component attachment mechanisms is the attachment to the computer chassis of rotary cooling fans used to assist in maintaining an acceptable thermal environment within the bay of the chassis. In order to prevent overheating of the components inside the bay of the chassis, air is typically circulated through the bay of the chassis by the rotary cooling fans. To provide this air circulation, the chassis is generally provided with an air intake opening and an exhaust opening in the walls of the chassis. The air intake opening and exhaust opening are typically located in opposing sidewalls of the chassis. One or more fans are typically located inside the bay of the chassis against the air intake opening such that, when energized, the fans pull air into the bay of the chassis through the air intake opening, and forces it out of the chassis through the exhaust opening, resulting in a cross-flow of air through the inside of the chassis.

Rotary cooling fans are typically attached to the frame of the chassis using screws. Often, in order to reduce noise and the potential for the screws to loosen over time, these screws are insulated from the chassis by rubber grommets and/or push fasteners. This attachment method has the disadvantage of requiring fasteners (i.e., screws and/or push fasteners) to be inserted through the chassis frame and fastened to the component itself. Assembly therefore requires complicated assembly-line equipment to align and insert all of the screws/fasteners and associated insulating components. In addition, when removing the system component, for example for repair, test, or access to circuitry or other system components whose access is blocked by the system component, the design of the fan attachment mechanism results in inconvenient, if not difficult, removal.

To eliminate some of the assembly time required to install system components in the bay of a computer system chassis, it would be desirable to provide a fastenerless mounting system. It would also be desirable to provide such a fastenerless mounting system that allows fast insertion and removal of the system component without requiring any special removal equipment.

SUMMARY OF THE INVENTION

Accordingly, it is an object of the present invention to provide an improved system component mounting system for a computer system.

It is another object to provide a system component mounting system for a computer system that allows fast insertion and removal of the system component without requiring any specialized equipment.

It is still another object to provide a system component mounting system for a computer system that is free from fasteners.

It is yet another object to provide a system component mounting system for a computer system that does not require a large number of components.

To accomplish these and other objects, a system component mounting device is provided in the form of a single clip to secure a system component to a computer chassis. A bay, or recess, is positioned in the chassis to receive the system component. The clip has a body with a bowed resilient portion. The clip also includes at least two tabs protruding in different directions from the clip body that are compressibly insertable into corresponding slots formed in the chassis.

In a preferred embodiment, to secure a system component to the chassis, a first tab of the clip is inserted into a corresponding slot in the frame of the chassis. The system component is positioned between the clip and portion of the chassis to which it is to be attached. The clip is then pivoted in a direction towards the portion of the chassis to which the system component is to be attached. As the clip is pivoted towards the chassis, a second tab on the clip approaches a corresponding second slot in the chassis. In order to position the second tab in its corresponding slot of the chassis to therefore achieve attachment of the system component to the chassis at the designated position in the chassis, the user manually compresses the clip to allow the second tab to clear the edge of the chassis and enter the corresponding second slot of the chassis. Upon removal of the manual compression of the clip, the clip expands, causing the second tab positioned in the corresponding second slot to remain in the slot. Thus, the system component is secured in place by the frictional force between the system component and chassis generated by the compressive force resulting from the bowed resilient portion of the clip against the system component.

In a preferred embodiment, the system component has a plurality of alignment mechanisms formed on the component body to allow complementary alignment mechanisms on the clip and/or chassis face to physically engage the system component to prevent any lateral movement of the system component in any direction parallel to the chassis face. In a preferred embodiment, the system component alignment mechanisms are hollows normally provided by the manufacturer for the insertion of screws. In this preferred embodiment, the clip body is formed with plugs positioned to physically match the position of the hollows on the system component when the system component is properly seated against the clip. Likewise, the portion of the chassis to which the system component is to be attached is formed to provide plugs positioned to physically match the position of the hollows on the system component when the system component is properly seated against the chassis by the clip. The plugs serve to physically hold the system component in position. Thus, the system component is secured in place by plugs that are inserted into hollows in the body of the system component and by the frictional force generated by the compressive force resulting from the resilient portion of the clip.

Furthermore, in the preferred embodiment, the clip body is formed with a component seat for support and alignment of the system component during and after attachment of the system component to the chassis. The component seat is provided on the face of the body that engages the system component. Depending on the application, the component seat may comprise a single or multiple support and/or alignment tabs or walls extending normal to the component contact face of the clip body. Furthermore, the component seat may be integrally formed with the clip body or may be welded, screwed, or otherwise attached to the clip body using known attachment means.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 2A is a plan view of a first embodiment of a clip implemented in accordance with the invention;

FIG. 2B is a side view of the clip of FIG. 2A;

FIG. 2C is a perspective view of the clip of FIG. 2A and 2B;

FIG. 3A is first perspective view of a rotary cooling fan implementing a system component;

FIG. 3B is a second perspective view of the rotary cooling fan of FIG. 3A;

FIG. 3C is a cross-sectional side view of the rotary cooling fan of FIG. 3A and 3B;

FIG. 4 is a cross-sectional side view of the clip of FIGS. 2A–2C attached to a chassis face without the system component;

FIG. 5A is a cross-sectional side view of a portion of a chassis as constructed according to the principles of the present invention, with the pivot tab of the clip of FIGS. 2A–2C inserted in the pivot slot of the chassis;

FIG. 6A is a cross-sectional side view of a portion of a chassis showing an alternative embodiment for attachment of a system component to a face of a chassis;

FIG. 6B is a perspective view of the clip of FIG. 6A;

FIG. 6C is a plan view of the clip of FIGS. 6A and 6B;

DETAILED DESCRIPTION

Figure 1:
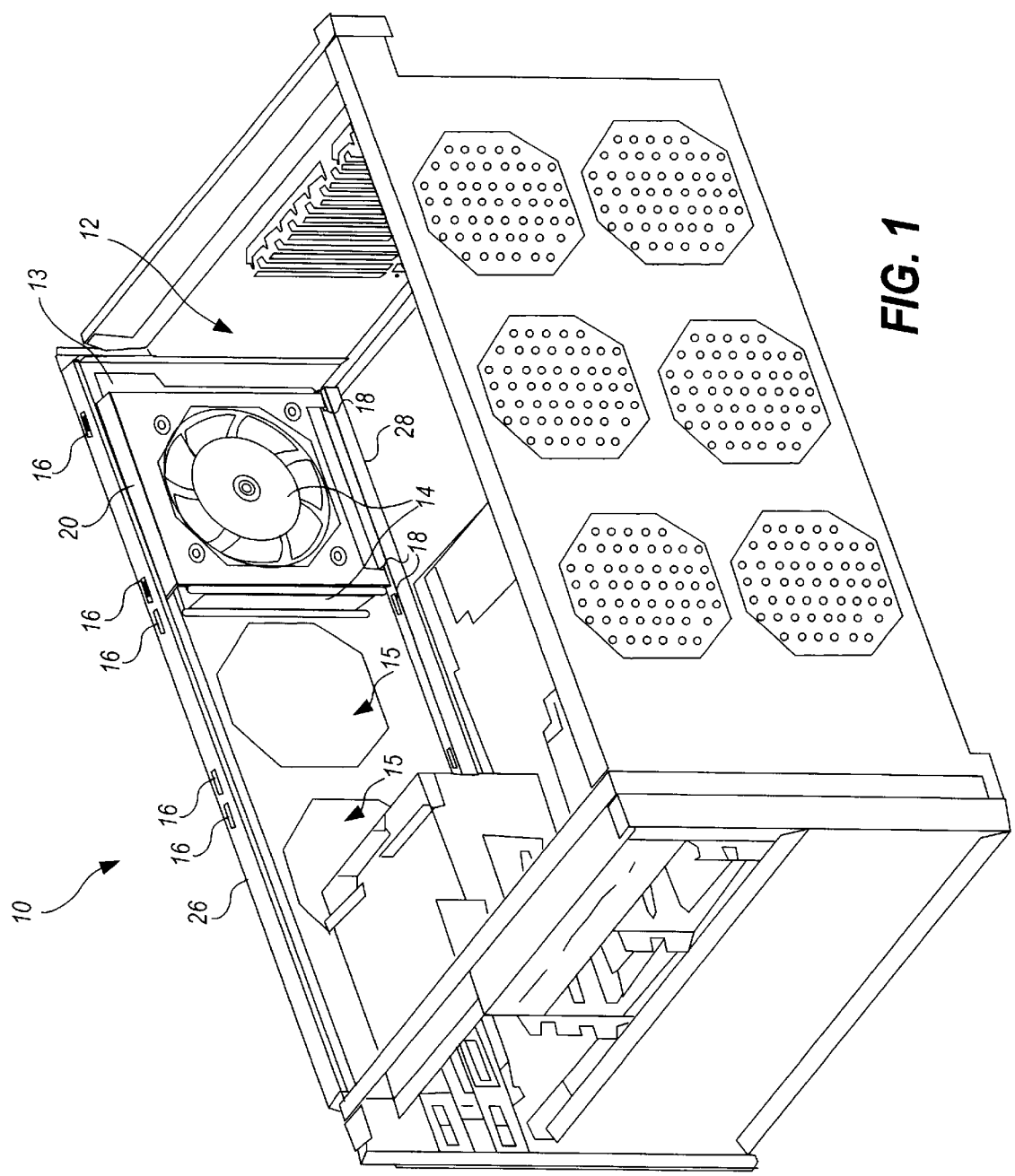
FIG. 1 is a perspective view of a chassis of a computer system and a system component that is mounted therein by a clip implemented in accordance with the invention.

Turning now to the drawings, FIG. 1 illustrates chassis 10 of a computer system. The chassis has a bay, or recess, 12 for housing a system component 14, such as a rotary fan. Bay 12 has a configuration and construction suitable for seating system component 14. The chassis 10 forms lateral face 13 of the bay 12 to which the system component 14 has been attached by a clip 20 of the invention. In the illustrative embodiment, lateral face 13 includes a plurality of intake openings 15 and system components 14 are rotary cooling fans to be positioned against the lateral face 13 in alignment with the intake openings 15. Each rotary cooling fan is attached in position to the lateral face 13 by a clip 20 having tabs that fit into hollow slots 16 and 18 formed in chassis 10. In the illustrative embodiment, slots 16 are formed in a first frame bar 26 attached to the upper portion of lateral face 13. Also in the illustrative embodiment, slots 18 are formed in a second frame bar 28 attached to the middle portion of lateral face 13.

Clip 20 firmly attaches system component 14 to the chassis 10 in bay 12, as described hereinafter.

FIGS. 2A–2C illustrate one preferred embodiment, shown at 200, of clip 20. As illustrated, clip 200 comprises a clip body 210 having a resilient portion 212, a pair of pivot tabs 220, and a pair of compression tabs 230. Preferably, the resilient portion 212 of the clip body 210 forms a bowed portion, bowed inwardly in the direction of the clip component face 214 which engages a system component (direction B of the B–B' axis).

Clip body 210 also preferably comprises a pair of alignment seats 250 and 252. In the illustrative embodiment, the system component is attached to a side wall (lateral face 13) of the chassis 10; accordingly, when the clip 200 is attached to the lateral face 13 of the chassis 10, as shown in FIG. 1, the clip 200 is positioned such that the A–A' axis is vertical up-down. Accordingly, in this embodiment, when the clip 200 is attached, alignment seat 250 is situated at a first end 211, or bottom end, the bottom 211 of the clip body 210, providing not only alignment, but also support for holding up a system component attached by the clip.

Pivot tabs 220 in this embodiment are formed integral to the clip body 210 at a first end 211 (A' of axis A–A') of the clip 200. To assist in pivoting the clip during attachment and removal of a system component to and from the chassis, as discussed hereinafter, pivot tabs 220 preferably comprise a hook portion 222.

Alignment seat 252 is formed integral to the clip body 210, protruding normal to the A–A' axis in the B direction of the B–B' axis and situated at a second end 213 (A of axis A–A'), or top end when attached to lateral face 13 of chassis 10, of the clip 200. Compression tabs 230 in this embodiment are formed integral and normal to the alignment seat 252, protruding from the alignment seat 252 in the A direction along the A–A' axis.

FIGS. 3A–3C illustrate one preferred embodiment, shown at 140, of system component 14. In this embodiment, system component 14 is a semi-autonomous rotary cooling fan 140 having a finned rotor 141 with fan blades thereon, control circuitry 147, and a power/control circuitry connector 148. Rotary cooling fan 140 is characterized by a pair of parallel opposing external faces 142 and 144, herein referred to as the clip face 142 and the chassis face 144 for reasons that will become clearer hereinafter. The depth of the rotary cooling fan 140 is the distance from the clip face 142 to the chassis face 144, shown as $D_{FAN}$.

The depth $D_{FAN}$ of the of the rotary cooling fan 140 is preferably greater than the minimum distance $D_{CLIP}$ between the resilient portion 212 of the clip 200 and the lateral face 113 of the chassis 110 when the clip 200 is clipped into position in the chassis without the system component, as illustrated in FIG. 4. The pivot slots 118 and compression tab slots 116 are positioned a distance from the lateral face 113 of the chassis 110 such that when the clip 200 is seated in the slots without the system component 140 seated therebetween, the shortest distance between the lateral face 113 of the chassis 110 and the inner-most point of the bowed resilient portion 212 of the clip 200 is less than the depth $D_{FAN}$ of the system component 140 to be attached.

Figure 5C:
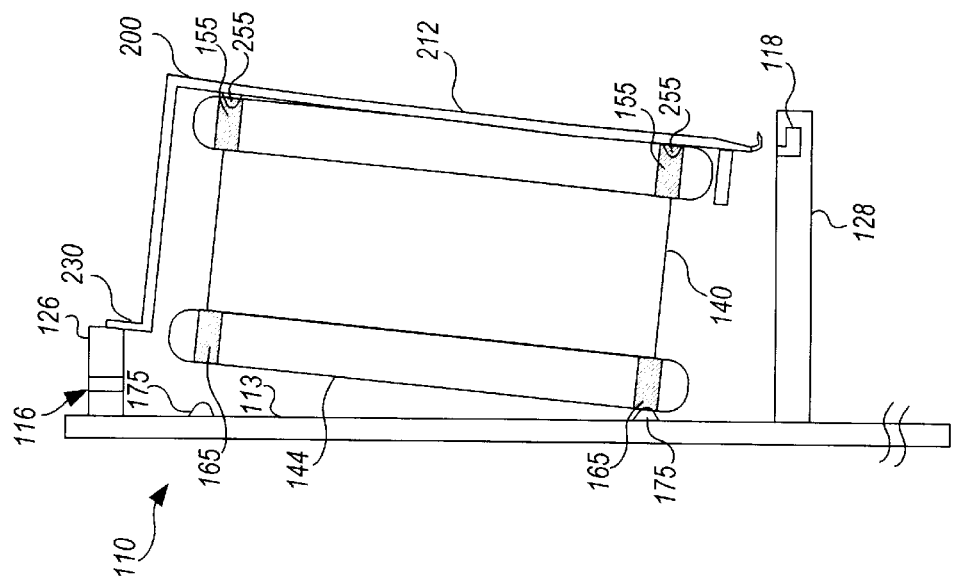
FIG. 5C is a cross-sectional side view of the portion of the chassis of FIGS. 5A–5B, with the compression tab blocked by the frame of the chassis prior to compression of the clip.
Figure 5B:
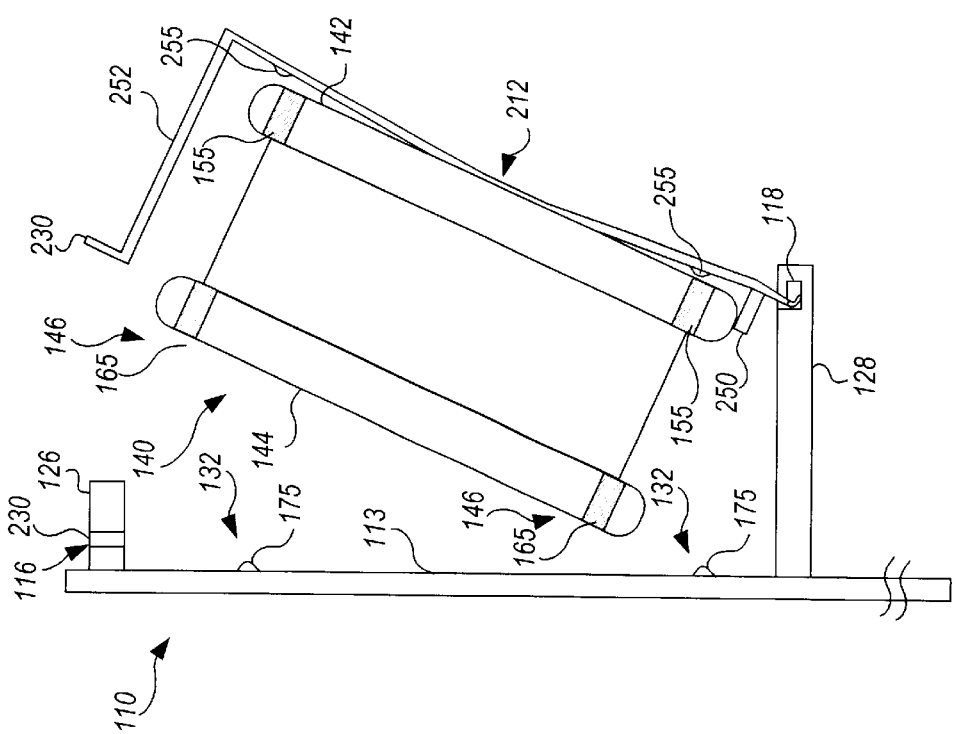
FIG. 5B is a cross-sectional side view of the portion of the chassis of FIG. 5A, showing the system component of FIGS. 3A–3C seated against the clip of the invention as the clip is pivoted towards the chassis face.
Figure 5E:
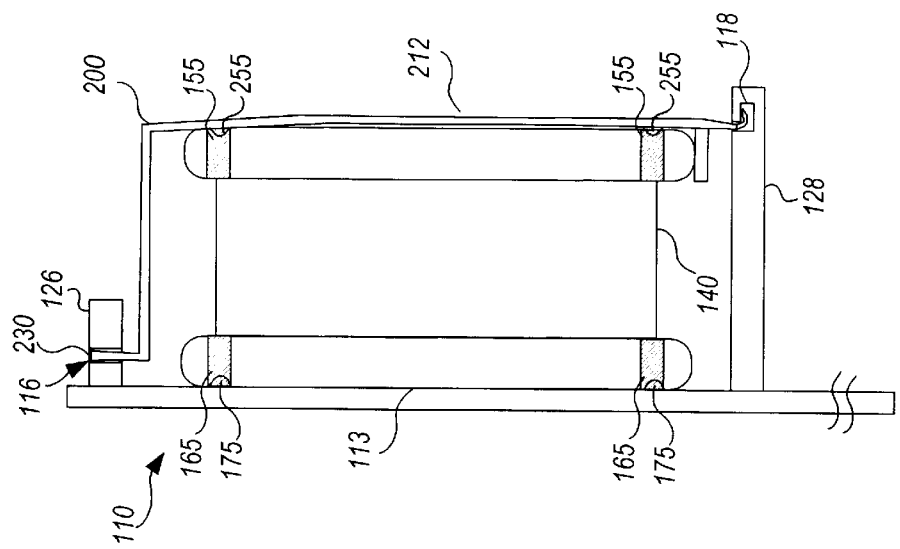
FIG. 5E is a cross-sectional side view of the portion of the chassis of FIGS. 5A–5D, showing the system component attached to the chassis by the clip in its final position.
Figure 5D:
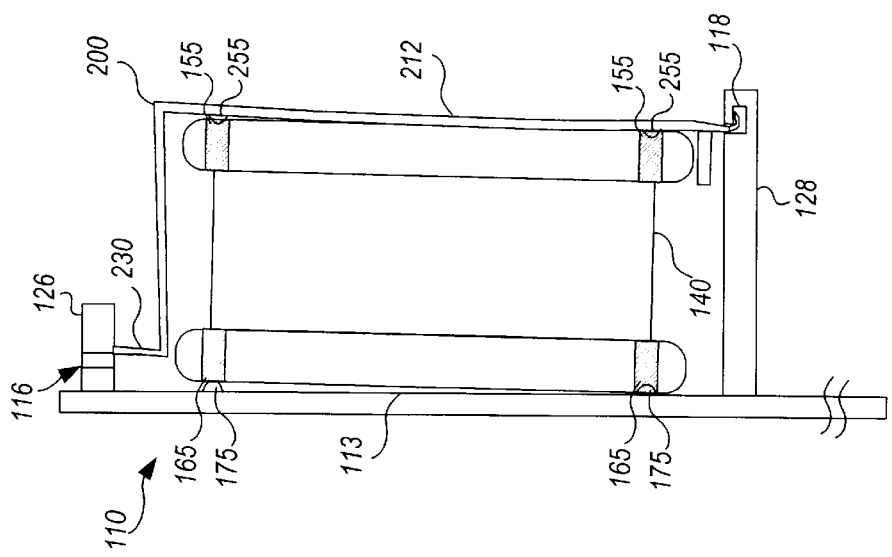
FIG. 5D is a cross-sectional side view of the portion of the chassis of FIGS. 5A–5C, with the clip compressed to allow the compression tab to clear the frame of the chassis as the clip is pivoted towards the chassis face.

FIGS. 5A–5E illustrate the attachment of rotary cooling fan 140 to the lateral face 113 of a chassis 110. Initially, as shown in FIG. 5A, the hook portion 222 of the pivot tabs 220 are inserted into the slots 118 of the frame bar 128. A system component (implemented by rotary cooling fan 140) is positioned and aligned on the clip component face 214 of the clip 200 using the alignment seats 250 and 252 as guides. The clip 200 is then pivoted towards the lateral face 113 of the chassis 110, as illustrated in FIG. 5B. As the second end 213 of the clip 200 approaches the lateral face 113 of the chassis 110, the upper frame bar 126 will block entry of the compression tabs 230 of the clip 200 from the compression tab slots 116, as illustrated in FIG. 5C. Accordingly, the clip 200 is forcibly compressed along the A–A' axis by manually applying compression force against either the compression tabs 230 themselves, or against the upper alignment seat 252. With sufficient compression of the clip 200, the compression tabs 230 clear the bottom face of the upper frame bar 126, as illustrated in FIG. 5D, until positioned at the compression tab slots 116. When the compression force is released, the compression tabs 230 enter the slots 116, as shown in FIG. 5E, where they are permanently positioned unless removed as discussed hereinafter.

Once the system component 140 is attached to the chassis 110 by the clip 200, the system component 140 is held in place by compression force generated by the bowed resilient portion 212 of the clip 200. More particularly, the resilient portion 212 of the clip 200 compresses against the fan 140. As described previously, the depth $D_{FAN}$ of the fan 140 is deeper than the distance $D_{CLIP}$ between the chassis face and inner-most point of the bowed resilient portion 212 of the clip 200. Accordingly, when a system component 140 is seated and attached to the lateral face 113 of the chassis 110 as described above, the bowed resilient portion 212 of the clip 200 applies a compression force against the clip face 142 of the system component 140. Of course, it is to be understood that the spring constant of the resilient portion 212 of the clip is to be fairly low and cannot creep. Accordingly, the clip 200 is preferably formed using a spring steel or spring plastic, so as to provide sufficient compression force to securely hold the system component 140 in position. The compression force against the clip face of the system component 140 results in a compression force between the chassis face of the system component 140 and the lateral face 113 of the chassis. Thus, the system component 140 is held securely in place due to the compression force of the bowed resilient portion 212 of the clip 200 and resulting frictional force between the component face 214 of the clip 100 and the clip face 142 of the system component 140 and resulting frictional force between the chassis face 144 of the system component 140 and the lateral face 113 of the chassis 110.

It will be appreciated that an added advantage of the clip 200 of the invention is that the bowed resilient portion 212 compensates for minor variations in the depth $D_{FAN}$ of the rotary cooling fan 140 when the difference between the distance $D_{CLIP}$ and the depth $D_{FAN}$ is greater than the depth tolerance of the rotary cooling fans 140.

To further assist with component alignment and to prevent lateral movement in any direction parallel to the plane of the lateral face 113 of the chassis 110, clip 200 is provided with clip alignment mechanisms 215 (see FIGS. 2A–2C) which are positioned to align to complementary component alignment mechanisms 145 on the clip face 142 of the system component 140 (see FIGS. 3A and 3C). In the illustrative embodiment, the component alignment mechanisms 145 of the system component 140 are holes (or hollowed recesses) 155 in the component clip face 142. Clip alignment mechanisms 215 are therefore implemented as plugs 255 which are positioned accordingly to allow the plugs 255 to fit into and be seated in the alignment holes 155 of the system component 140.

As illustrated in FIGS. 5A–5E, plugs 255 of the clip 200 are insertable into holes 155 of system component 140, thereby physically engaging system component 140. Once the plugs 255 are inserted into holes 155 of system component 140 and the component 140 is attached to the chassis by the clip 200, the system component 140 cannot physically move in any lateral direction (i.e., any direction parallel to the plane of the lateral face 13 of the chassis 10) regardless of the strength of the compression force supplied by the resilient portion 212 of the clip 200.

As is known in the art, most manufacturers of system components typically provide a plurality of screw holes the faces of the system component to be used for screw attachment. It is these screw holes that are used to implement the hollows 155 into which the plugs 255 of the current invention fit to secure the system component to the chassis. Accordingly, no redesign of the system component is required.

Also in the preferred embodiment, and to further assist with alignment, lateral face 113 of chassis 110 is also provided with chassis alignment mechanisms 132 which are positioned to align to complementary component alignment mechanisms 146 on the chassis face 144 of the system component 140. In the illustrative embodiment, the component alignment mechanisms 146 of the system component 140 are holes (or hollowed recesses) 165 in the component chassis face 144. Chassis alignment mechanisms 132 are therefore implemented as plugs 175 which are positioned accordingly to allow the plugs 175 to fit into and be seated in the alignment holes 165 of the system component 140.

As illustrated in FIGS. 5A–5E, plugs 175 of the lateral face 113 of the chassis 110 are insertable into holes 165 of system component 140, thereby physically engaging system component 140. Once the plugs 175 are inserted into holes 165 of system component 140 and the component 140 is attached to the chassis by the clip 200, the system component 140 cannot physically move in any lateral direction (i.e., any direction parallel to the plane of the lateral face 113 of the chassis 110) regardless of the strength of the compression force supplied by the resilient portion 212 of the clip 200.

It will be appreciated that the alignment mechanisms of the clip 20, system component 14, and chassis 10 may vary from design to design, including but not limited to the use of complementary alignment configurations such as pins/holes, tabs/slots, snaps, etc. Furthermore, it will be appreciated that although the alignment configuration of the embodiment shown in FIGS. 2A–2C, 3A–3C and 5A–5E illustrate alignment plugs on the chassis and clip with complementary hollows on the system component, the configuration may be reversed such that the plugs are in one or both faces of the system component and the hollows are in one or both of the chassis and clip.

To remove the system component 140 from the chassis 110, one need only reverse the steps of insertion illustrated in FIGS. 5A–5E). In particular, sufficient compressive force is applied either to the compression tabs themselves via the upper opening of the compression tab slot 116 on the upper face of the frame bar 126, or to the upper alignment seat 252 to which the compression tabs 230 are attached, to allow the compression tabs 230 to clear the slots 116 in the frame bar 126 (see FIG. 5D). Once the compression tabs 230 are positioned to exit the compression tab slots 116 and clear the frame bar 126, the clip 200 is pivoted in a direction away from the chassis face 13 to allow the compression tabs to fully clear the frame bar 126 (see FIG. 5C). The compressive force may then removed and the system component 140 removed from the clip 200. The clip 200 is fully removed by removing the pivot tabs 230 from the pivot slots 118. If the pivot tabs 230 are formed with a hook portion 222, this requires pivoting the clip 200 away from the lateral face 113 of the chassis far enough to allow the hook portion 222 to clear the pivot slot 118 (see FIG. 5A).

FIGS. 6A–6C illustrate an alternative embodiment of a clip 320 implemented in accordance with the principles of the invention. In this embodiment, a system component 314 is attached to a horizontal face 313 of a chassis 310. The horizontal face 313 of the chassis 310 comprises a hooked pivot slot 332 and a hooked compression slot 333.

The clip 320 includes a resilient portion 321 upon which a system component 314 is supported, and a pair of hooked tabs 322 and 323. To attach the component 314 to the face 313 of the chassis, hooked tab 322 is hooked into hook slot 322, and hooked tab 323 is hooked into hook slot 323 by sufficiently manually compressing the resilient portion 321 of the clip 320. Once manual compression is removed, the resilient portion 321 exerts compression force against the system component 314 to securely hold it in place. Optionally, the chassis face 313, system component 314, and/or clip 320 may be provided with alignment mechanisms. In the illustrative embodiment shown, system component 314 is provided with alignment pins 315 and 316 on opposing faces. Clip 320 in this embodiment is provided with an alignment hole 325. System component 314 is aligned on clip 320 by inserting pin 315 through alignment hole 325. Also in the illustrative embodiment, chassis face 313 is provided with an alignment hole 326 that positionally lines up with pin 316 of system component 314 when component 314 is properly attached to the chassis face 313 by clip 320.

Figure 7A:
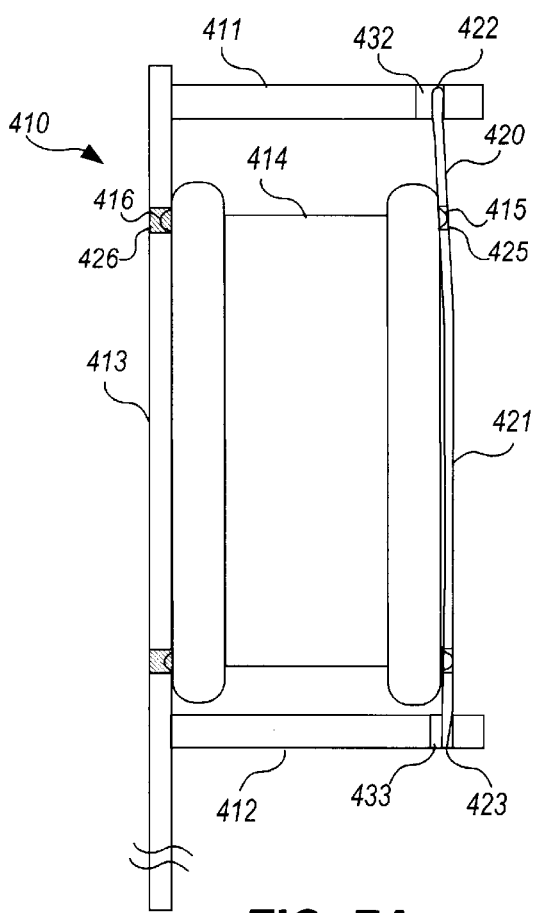
FIG. 7A is a cross-sectional side view of a portion of a chassis showing another alternative embodiment for attachment of a system component to a face of a chassis.
Figure 7B:
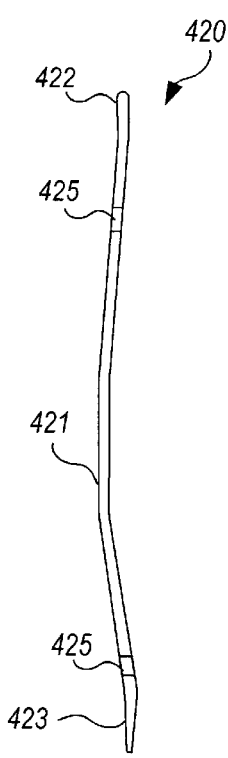
FIG. 7B is a side view of the clip of FIG. 7A.
Figure 7C:
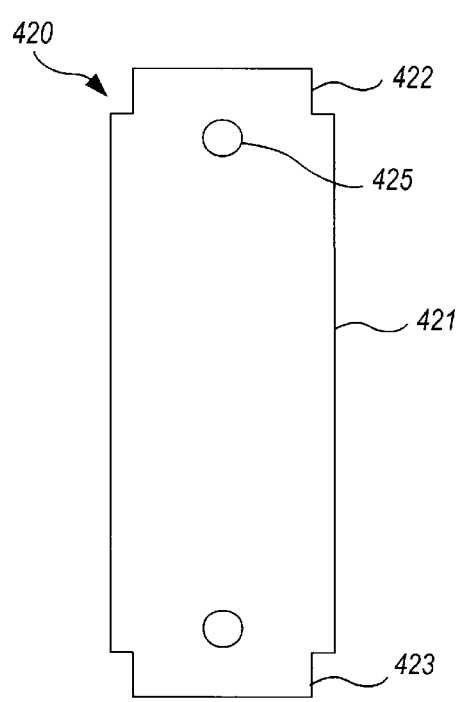
FIG. 7C is a plan view of the clip of FIGS. 7A and 7B.

FIGS. 7A–7C illustrate yet another alternative embodiment of a clip 420 implemented in accordance with the principles of the invention. In this embodiment, a system component 414 is attached to a lateral face 413 of a chassis 410. An upper horizontal face 411 of the chassis 410 comprises a slot 432 and a lower horizontal face 412 of the chassis 410 comprises a slot 433. The clip 420 comprises a bowed resilient body 421 with a tab 422 at one end of the bow and a tab 423 at the opposite end of the bow.

To insert the attach the component 414 to the lateral face 413 of the chassis 410, the component 414 is positioned against the lateral face 413 of the chassis. One of the tabs 422 or 423 is inserted into one of the respective slots 432 or 433. The clip 400 is pivoted towards the remaining respective slot 433 or 432 and the clip is manually compressed to allow the remaining respective tab 423 or 422 to enter its respective slot. Upon removal of the manual compression, the component 413 is compressively held against the lateral face 413 of the chassis 410 by the clip 420.

The chassis face 413, system component 414, and/or clip 420 may be provided with alignment mechanisms. In the illustrative embodiment shown, system component 414 is provided with alignment plugs 415 and 416 on opposing faces. Clip 420 in this embodiment is provided with an alignment hole 425. System component 414 is aligned on clip 420 by inserting plug 415 through alignment hole 425 of the clip 420. Also in the illustrative embodiment, chassis face 413 is provided with an alignment hole 426 that positionally lines up with plug 416 of system component 414 when component 414 is properly attached to the chassis face 413 by clip 420.

It will be appreciated by those skilled in the art that the position of the attachment tabs is not limited to opposing ends of the clip body. The tabs may be located on any at least two positions of the body that will allow sufficient compression of the resilient portion of the clip to allow insertion of the tabs into their respective slots, while also allowing the resilient portion of the clip body to exert sufficient compression force on the system component to hold the system component in place once the tabs are released into their respective slots.

As described above, the present invention provides a fastenerless clip for securely attaching a system component of a computer system to the system chassis. The invention allows fast simple attachment and removal of the system component without requiring any specialized equipment, thereby reducing the time and costs of computer system assembly and disassembly during both mass-production assembly and individual unit test and repair.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, it should be understood that the term "system component" as used in both the specification and the claims includes any autonomous or semi-autonomous device that is typically mountable in a bay in a computer chassis, including but not limited to rotary cooling fans, permanent and removable hard disk drives, floppy disk drives, CD and/or DVD ROM drives, modems, digital video disk drives, zip drives, tape drives, and any peripheral computer component. It is also possible that other benefits or uses of the currently disclosed invention will become apparent over time.

What is claimed is:

1. A clip for attaching a system component to a chassis, said chassis comprising a first slot and a second slot, comprising:
   a clip body comprising a bowed resilient portion;
   a non-compressible pivot tab protruding in a first direction from said clip body;
   a compressible tab protruding in a second direction from said clip body;
   wherein said bowed resilient portion spring biases said system component securely against a face of said chassis when said pivot tab is seated in said first slot and said compressible tab is compressibly inserted into and seated in said second slot.

2. A clip in accordance with claim 1, wherein said resilient portion comprises a bowed portion characterized by an arc.

3. A clip in accordance with claim 1, wherein:
   said clip body comprises an alignment seat for aligning said system component to said clip.

4. A clip in accordance with claim 1, comprising:
   an alignment mechanism for aligning said system component to a predetermined position with said clip.

5. A clip in accordance with claim 4, wherein:
   said alignment mechanism comprises a plug.

6. A clip in accordance with claim 4, wherein:
   said alignment mechanism comprises an aperture.

7. A clip in accordance with claim 1, comprising:
   one or more additional compressible tabs protruding from said clip body, each of said one or more additional compressible tabs being compressibly insertable into a respective corresponding additional slot of said chassis.

8. A clip in accordance with claim 1, comprising:
   an aperture formed in said clip body.

9. A clip in accordance with claim 1, wherein:
   said pivot tab is formed integral to said clip body.

10. A clip in accordance with claim 1, wherein:
    said compressible tab is formed integral to said clip body.

11. A method for attaching a system component to a face of a chassis with a clip, said clip comprising a clip body having a resilient portion, non-compressible pivot tab, and a compressible tab, comprising:
    inserting said pivot tab of said clip into a first slot of said chassis;
    positioning said system component between said clip and said chassis face;
    pivoting said clip towards said chassis face;
    compressing said clip; and
    inserting said compressible tab into a second slot of said chassis.

12. A method for removing a system component attached to a face of a chassis with a clip, said clip comprising a clip body having a resilient portion, a non-compressible pivot tab seated in a first slot of said chassis, and a compressible tab seated in a second tab of said chassis, said method comprising:
    compressing said clip; and
    removing said compressible tab from said second slot of said chassis;
    pivoting said clip away from said chassis face;
    removing said pivot tab from said first slot of said chassis; and
    removing said system component from said clip.

13. A computer housing, comprising:
    a chassis having a bay for receiving a system component, said chassis comprising a first slot and a second slot;
    a system component characterized by a component depth and attachable to said chassis along a face of said bay; and
    a clip comprising a non-compressible pivot tab seatable in said first chassis slot and a compressible tab compressibly insertable into said second chassis slot, and a resilient portion that resiliently biases said system component against said face of said bay when said system component is seated in said clip, said pivot tab is seated in said first chassis slot, and said compressible tab is seated in said second chassis slot.

14. The computer housing of claim 13, wherein said face of said bay is a lateral face.

15. The computer housing of claim 13, wherein said face of said bay is a horizontal face.

16. The computer housing of claim 13, wherein:

said clip comprises an alignment mechanism for aligning said system component to said clip.

17. The computer housing of claim 16, wherein:

said alignment mechanism comprises a plug.

18. The computer housing of claim 16, wherein:

said alignment mechanism comprises an aperture.

19. The computer housing of claim 13, wherein:

said system component comprises a rotary cooling fan having a rotor with fan blades thereon; and said clip comprises an aperture exposing said rotor.

* * * * *